United States Patent [19]

Darms et al.

[11] Patent Number: 4,503,285

[45] Date of Patent: Mar. 5, 1985

[54] FLEXIBLE BASE MATERIALS, THEIR PREPARATION AND THEIR USE FOR PRINTED CIRCUITS

[75] Inventors: Roland Darms, Therwil; Theobald Haug, Frenkendorf; Harry Beyeler, Basel, all of Switzerland

[73] Assignee: Ciba-Geigy Corporation, Ardsley, N.Y.

[21] Appl. No.: 612,996

[22] Filed: May 21, 1984

Related U.S. Application Data

[60] Division of Ser. No. 422,425, Sep. 23, 1982, abandoned, which is a continuation of Ser. No. 298,963, Sep. 3, 1981, abandoned.

[30] Foreign Application Priority Data

Sep. 15, 1980 [CH] Switzerland .......................... 6904/80
Jul. 3, 1981 [CH] Switzerland .......................... 4397/81

[51] Int. Cl.$^3$ ............................................. H05K 1/00
[52] U.S. Cl. ................................... 174/68.5; 428/458; 428/473.5; 428/474.4; 427/96; 525/432
[58] Field of Search ...................... 428/458, 473.5, 45; 525/432; 174/68.5; 427/96

[56] References Cited

U.S. PATENT DOCUMENTS 3,582,458  6/1971  Haller .
3,682,960  8/1972  Haller .
3,894,114  7/1975  Lohmann et al. .
4,124,651 11/1978  Lohmann et al. .
4,148,969  4/1979  Henderson .
4,553,954 10/1982  Yamaoka et al. ................... 174/68.5

FOREIGN PATENT DOCUMENTS 2128376 10/1972  France .
1444421  7/1976  United Kingdom .

OTHER PUBLICATIONS

Chem. Abst. 87, 77490p (1977).
Chem. Abst. 86, 157218a (1977).
Chem. Abst. 77, 157944y (1972).

*Primary Examiner*—George F. Lesmes
*Assistant Examiner*—E. Rollins Buffalow
*Attorney, Agent, or Firm*—Luther A. R. Hall

[57] ABSTRACT

Flexible base materials consisting of a metal foil and a film, firmly adhering thereto without an interlayer, of a polyamide/polyimide block copolymer of the formula I, or of a polyamide/polyimide copolymer prepared from a polyamide acid block of the formula IVa or Va and a dicarboxylic acid dichloride of the formula XI and a diamine of the formula XII.

The individual symbols are defined in claim 1.

The base materials according to the invention are suitable for the preparation of flexible printed circuits.

6 Claims, No Drawings

FLEXIBLE BASE MATERIALS, THEIR PREPARATION AND THEIR USE FOR PRINTED CIRCUITS

This is a divisional of application Ser. No. 422,425, filed Sept. 23, 1982, which in turn is a continuation of application Ser. No. 298,963, filed on Sept. 3, 1981, now abandoned.

The present invention relates to flexible base materials which consist of metal foils coated with polyamide/polyimide block copolymers or polyamide/polyimide copolymers, to processes for their preparation and to their use for the preparation of flexible printed circuits.

As is known, flexible printed circuits have many technical advantages compared with rigid printed circuits. They are easier to handle, since they can be incorporated into the system as an electronic component in virtually any form, thus require less space in the electrical apparatus and are also less sensitive to vibrations.

However, stringent demands are made on the flexible base material, viz. the metal foil coated with an insulating material, which is used for the preparation of printed circuits. The coating must have very good adhesion to the metal foil and must, without damage, survive the processes involved in the preparation of printed circuits; this means that the coating must have good resistance to soldering baths and good resistance to the solvents used in printed circuit board technology. Additionally, the flexible base material must be able to be bent, rolled, twisted and folded, without cracks forming in the coating.

It is known to coat metal foils with polyimide films by laminating the polyimide film on a copper foil provided with a binder. The laminates which have been prepared in this way and contain a binder layer do not in every respect meet the abovementioned requirements; in particular, their electrical properties leave something to be desired.

Moreover, U.S. Pat. No. 3,682,960 has disclosed the coating of metals with a mixture of a polyamide acid and a polyamide acid which has been modified with amides. The coatings of polyimides and polyamide-imides obtained on the metals after heating have, however, the disadvantage that they are not sufficiently flexibe and readily flake off the metal foil when this is bent.

To obviate these disadvantages, it is therefore proposed in U.S. Pat. No. 4,148,969 to use laminates of metal foils which have been coated with polyparabanic acids, and the polyparabanic acid used is prepared by hydrolysis of the reaction product of diphenylmethane diisocyanate with hydrogen cyanide. Apart from the fact that the preparation of the polyparabanic acid used is complicated, hydrogen cyanide must be used in the first stage, and this necessitates the taking of additional precautions.

It has now been found that flexible base materials consisting of polymer films which firmly adhere to metal foils without an interlayer, are obtained in a simpler manner when the metal foil is coated with an organic solution of a polyamide/polyamide acid block copolymer or polyamide/polyamide acid copolymer and the metal coating is converted, while hot and with evaporation of the organic solvent, into a polyamide/polyimide block polymer or polyamide/polyimide copolymer respectively.

The present invention thus relates to flexible base materials for the preparation of flexible printed circuits, which materials consist of a metal foil coated with a polymer, without an interlayer, wherein the polymer coating consists of a polyamide/polyimide block copolymer with recurring structural elements of the formula I

in which n is an integer from 1 to 500, A is a polyamide block with a basic structural unit of the formula II or III

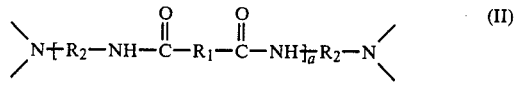

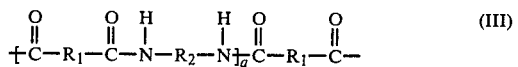

and E is a polyimide block with a basic structural unit of the formula IV or V

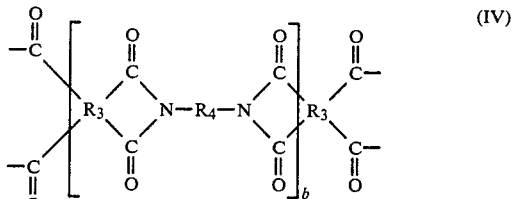

or

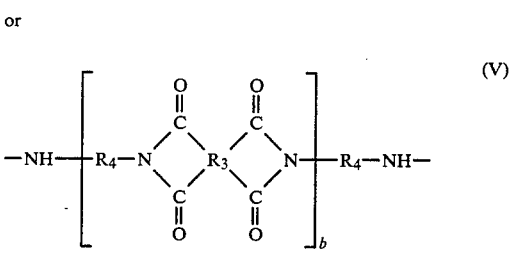

or consists of a polyamide/polyimide copolymer which is obtained by reacting polyamide acids of the formula IVa or Va

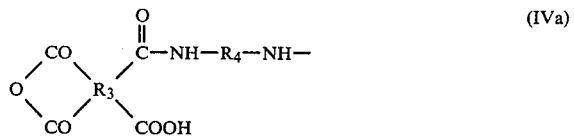

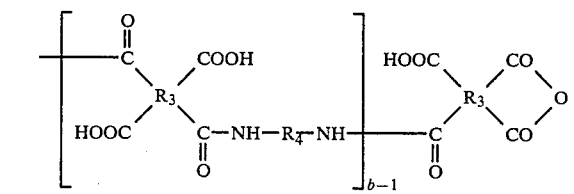

or

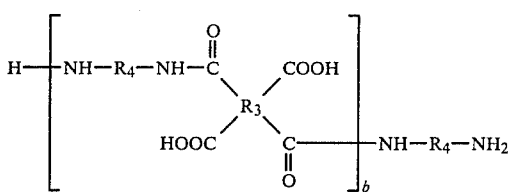

with dicarboxylic acid dichlorides of the formula XI

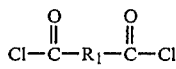

and diamines of the formula XII $$H_2N-R_2-NH_2 \quad (XII)$$

and subsequently cyclising the polyamide/polyamide acid copolymers thus obtained, in which formulae the symbols a and b independently of one another are integers from 2 to 100, $R_2$ and $R_4$ independently of one another are a monocyclic aromatic radical which is unsubstituted or substituted by halogen atoms or alkyl or alkoxy groups each having 1-4 C atoms, an unfused bicyclic aromatic radical which is unsubstituted or substituted by halogen atoms or alkyl or alkoxy groups each having 1-4 C atoms and in which the aromatic nuclei are linked together via —O—, —CH$_2$— or —SO$_2$—, or a heterocyclic radical, alkylene having 2-12 C atoms or a dicyclohexylmethane radical, $R_1$ is an aromatic or heterocyclic radical or alkylene having 2 to 8 C atoms, the carbonyl groups being bonded to different carbon atoms, and $R_3$ is a 5-membered or 6-membered cycloalkyl radical, a benzene ring or an unfused bicyclic aromatic radical in which the aromatic nuclei are linked together via the bridge member —O—, —CO— or —CONH— and the carbonyl groups are bonded to different ring C atoms which are adjacent in pairs.

Preferably, the base material according to the invention contains a copper foil as the metal foil.

The coating, adhering to the metal foil, of a polyamide/polyimide block copolymer preferably consists of a block copolymer in which, in the formula I, n is an integer from 1 to 500, A is a polyamide block of the formula II or III and E is a polyimide block of the formula IV or V, in which formulae a and b independently of one another are integers from 2 to 100, $R_2$ and $R_4$ independently of one another are a monocyclic aromatic radical which is unsubstituted or substituted by halogen atoms or alkyl or alkoxy groups each having 1-4 C atoms, an unfused bicyclic aromatic radical which is unsubstituted or substituted by halogen atoms or alkyl or alkoxy groups each having 1-4 C atoms and in which the aromatic nuclei are linked together via —O—, —CH$_2$— or —SO$_2$—, or a heterocyclic radical, $R_1$ is an aromatic or heterocyclic radical, the carbonyl groups being bonded to different carbon atoms, and $R_3$ is a benzene ring or an unfused bicyclic aromatic radical in which the aromatic nuclei are linked together via the bridge member —O—, —CO— or —CONH—, the carbonyl groups being bonded to different ring carbon atoms which are adjacent in pairs.

In particular, these coatings consist of a polyamide/polyimide block copolymer of the formula I, in which A is a polyamide block of the formula II and E is a polyimide block of the formula IV, and in which a is an integer from 2 to 50 and b is an integer from 2 to 50, especially 10 to 50.

In a preferred embodiment, these coatings consist of a polyamide/polyimide block copolymer of the formula I, in which A is a polyamide block of the formula II and E is a polyimide block of the formula IV, and in which a is an integer from 2 to 50 and b is an integer from 10 to 50, $R_1$ is a 1,3-phenylene radical, $R_2$ is a 4,4'-diphenyl ether, 4,4'-diphenylmethane or 1,3-phenylene radical, $R_3$ is a benzene ring or a benzophenone ring system and $R_4$ is a 4,4'-diphenyl ether, 4,4'-diphenylmethane, 1,3-phenylene or 1,4-phenylene radical.

In a further preferred embodiment, the coating adhering to the metal foil consists of a polyamide/polyimide copolymer which is obtained by reacting a polyamide acid of the formula IVa or Va with dicarboxylic acid dichlorides of the formula XI and diamines of the formula XII, in which formulae b is an integer from 2-50, $R_1$ is —(CH$_2$)$_4$— or 1,3-phenylene, preferably 1,3-phenylene, $R_2$ is 1,3-phenylene or a 4,4'-diphenyl ether radical, $R_3$ is a benzene ring or a benzophenone ring system and $R_4$ is 1,3- or 1,4-phenylene, or a 4,4'-diphenyl ether or 4,4'-diphenylmethane radical, and subsequently cyclising the polyamide/polyamide acid copolymer obtained.

The flexible base materials according to the invention are obtained by coating a metal foil with an organic solution of a polyamide/polyamide acid block copolymer with the recurring structural element of the formula VI

in which $A_1$ is a polyamide block with a mean molecular weight of 350 to 20,000 and with a basic structural unit of the formula VII or VIII

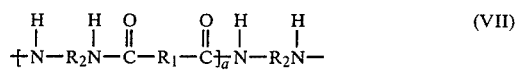

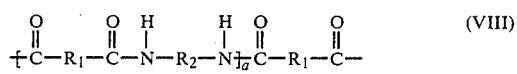

and $E_1$ is a polyamide acid block with a basic structural unit of the formula XI or X

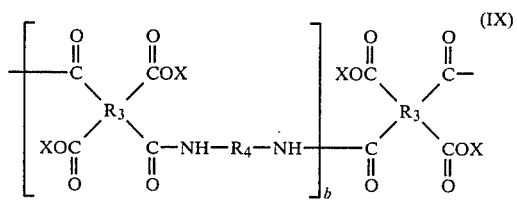

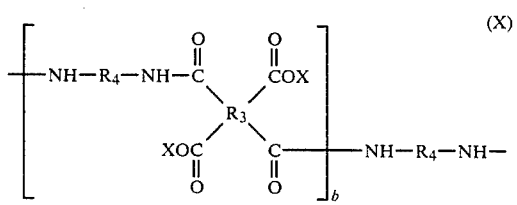

or with an organic solution of a polyamide/polyamide acid copolymer which is obtained by reacting polyamide acids of the formula IVa or Va

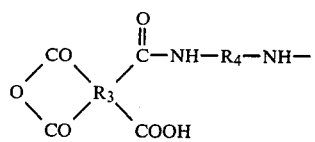 (IVa)

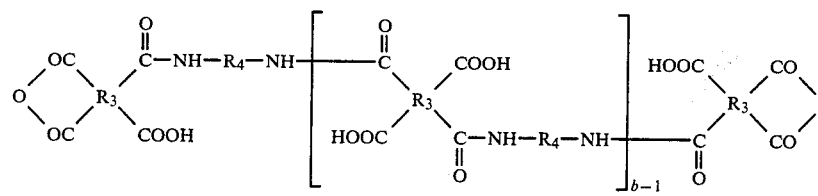

or

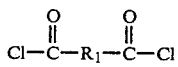

(Va)

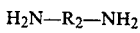

with dicarboxylic acid dichlorides of the formula XI $$Cl-\overset{O}{\underset{\|}{C}}-R_1-\overset{O}{\underset{\|}{C}}-Cl \qquad (XI)$$

and diamines of the formula XII $$H_2N-R_2-NH_2 \qquad (XII)$$

in which formulae X in each case is a hydrogen atom or alkyl having 1 to 4 C atoms and n, a, b, $R_1$, $R_2$, $R_3$ and $R_4$ are as defined in formulae I to V, and subsequently heating the coated metal foil in the temperature range from 50° to 300° C. until a coating is obtained which is at least tackfree.

Depending on the coating processes used, the temperatures and the duration of heating, the cyclisation of the polyamide/polyamide acid block copolymers to give the polyamide/polyimide block copolymers, or of the polyamide/polyamide acid copolymers to give the polyamide/polyimide copolymers, proceeds with more or less complete conversion. To achieve optimum properties, it may be necessary afterwards to heat the laminate once more at, for example, 300° C. for several hours.

The polyamide/polyamide acid block copolymers used for coating metal foils are known and can be prepared, for example, by the processes described in German Offenlegungsschrift No. 2,342,464, by reacting polyamides of the formula

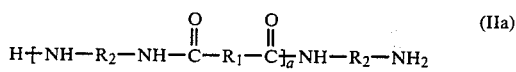 (IIa)

with polyamide acid dianhydrides of the formula

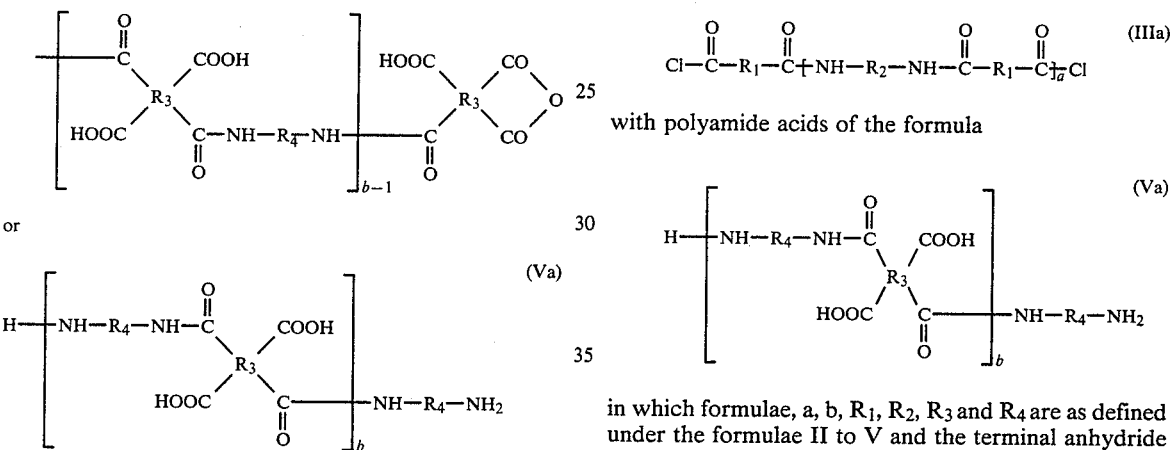 (IVa)

or by reacting polyamides of the formula $$Cl-\overset{O}{\underset{\|}{C}}-R_1-\overset{O}{\underset{\|}{C}}+NH-R_2-NH-\overset{O}{\underset{\|}{C}}-R_1-\overset{O}{\underset{\|}{C}}_{\overline{|a}}Cl \qquad (IIIa)$$

with polyamide acids of the formula

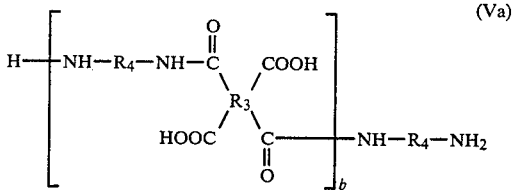 (Va)

in which formulae, a, b, $R_1$, $R_2$, $R_3$ and $R_4$ are as defined under the formulae II to V and the terminal anhydride groups in the formula IVa are each bonded to adjacent ring C atoms of $R_3$.

The preparation of the polyamides and polyamide acids of the formulae IIa to Va is likewise described in German Offenlegungsschrift No. 2,342,464. The polyamide/polyamide acid copolymers which are also used for coating metal foils and which contain a polyamide acid block of the formula IVa or Va are known from German Offenlegungsschrift No. 2,342,454.

The quoted German Offenlegungsschriften also disclose that the polyamide/polyamide acid block copolymers or polyamide/polyamide acid copolymers are suitable for the coating or adhesive bonding of substrates of the most diverse types, such as metals, polymers or cellulose materials, but there is no indication to the effect that the metal foils which have been coated with polyamide/polyimide block copolymers or polyamide/polyimide copolymers have the property of being extremely flexible, i.e. that they withstand repeated bending and folding without cracks forming in the polymer film and, additionally, they have good resistance to soldering baths and good resistance to the solvents used in printed circuit board technology.

The polyamide/polyamide acid block copolymers and polyamide/polyamide acid copolymers, used according to the invention, in general have an inherent viscosity of 0.5 to 2.5, and 0.1 to 2.5 respectively, in particular 0.8 to 1.5. The inherent viscosity $\eta_{inh.}$ which is a measure of the molecular weight of a polymer is calculated according to the following equation:

$$\eta_{inh.} = \frac{\ln \frac{\eta}{\eta_o}}{c}$$

in which ln is the natural logarithm, $\eta$ is the viscosity of the solution (0.5% by weight of the polymer in a suitable solvent, for example N,N-dimethylacetamide, N,N-dimethylformamide, N-methylpyrrolidone or concentrated sulfuric acid), $\eta_o$ is the viscosity of the solvent and c is the concentration of the polymer solution in g of polymer/100 ml of solvent.

The viscosity measurements are carried out at 25° C.

The polyamide/polyamide acid block copolymers or polyamide/polyamide acid copolymers, which are preferably prepared in an anhydrous organic solvent and with exclusion of moisture, are advantageously processed in the form of these organic solutions. N,N-Dimethylacetamide, N,N-diethylacetamide, N,N-dimethylformamide, N,N-dimethylmethoxyacetamide, N-methyl-2-pyrrolidone, N-acetyl-2-pyrrolidone, N-methyl-ε-caprolactam, hexamethylphosphoric acid triamide (Hexametapol), N,N,N',N'-tetramethylurea, tetrahydrothiophene dioxide (sulfolane) and dimethyl sulfoxide are suitable organic solvents.

Mixtures of such solvents can also be used. On the other hand, it is also possible to dilute these preferred solvent systems with other organic aprotic solvents, such as aromatic, cycloaliphatic or aliphatic hydrocarbons or chlorinated hydrocarbons, for example benzene, toluene, xylenes, cyclohexane, pentane, hexane, petroleum ether, methylene chloride, tetrahydrofuran, cyclohexanone and dioxane.

To improve the storage stability of the organic solution of the polyamide/polyamide acid block copolymers or polyamide/polyamide acid copolymers, it is advantageous to add a water-absorbing substance, for example a molecular sieve, to the solution. Molecular sieves are advantageously added in quantities of about 10 percent by weight, relative to the quantity of organic solution. Molecular sieves are commercially available, for example as a commercial product from Messrs. Merck.

Surprisingly, it has also been found that it is advantageous, before processing, to add a flow control agent, for example "Modaflow" (commercial product from Messrs. Monsanto), "FC 430" or "FC 170" (commercial products from Messrs. 3M) or "Lodyne S 107" (commercial product from Ciba-Geigy), to those organic coating solutions which are processed at elevated temperatures or by machine. As is known, flow control agents, or levelling agents as they are also called, are substances which reduce the surface tension of a solution.

The coating of the metal foils with the organic polymer solutions can be carried out either manually or by means of coating machines, including vertical coating machines. In coating by machine, the only important point is that a tack-free coating is obtained on the metal foil, so that this laminate can be rolled up if desired. To obtain optimum properties, this laminate can afterwards be heated at elevated temperatures, for example at 180° C. for 4 hours and at 210° C. for 2 hours. virtually complete cyclisation of the polyamide/polyamide acid block copolymers or polyamide/polyamide acid copolymers taking place to give the corresponding polyamide/polyimide block copolymers or polyamide/polyimide copolymers respectively. The metal foils coated in this way can be used directly for the preparation of printed circuits by exposing the film, which is provided with a photolacquer on the metal side, through a photo mask and developing the exposed metal foil in a known manner. Flexible, printed circuits are thus obtained.

EXAMPLE 1

A. Preparation of a Polyamide Block with Amino End Groups 7.786 g (0.072 mol) of m-phenylenediamine are dissolved, under nitrogen and with stirring, in 100 g of anhydrous N,N-dimethylacetamide in a sulfonation flask fitted with a stirrer, internal thermometer, dropping funnel, nitrogen inlet tube and pressure-compensating vessel, to give a clear solution which is cooled to −15° C. 12.994 g (0.064 mol) of isophthalic acid dichloride in the solid form are introduced in portions in the course of 30 minutes at −15° to −10° C. Subsequently, the reaction mixture is kept at 0° C. for 1 hour in order to let the reaction go to completion. 12.952 g (0.128 mol) of trimethylamine are then added dropwise at 0° to 5° C. in the course of 30 minutes and the solution is kept at 5° to 10° C. for a further hour, with stirring. The triethylamine hydrochloride which has precipitated is filtered off with suction through a glass frit and the filter cake is washed with 14 g of anhydrous N,N-dimethylacetamide.

B. Preparation of a Polyamide Acid Block with Anhydride End Groups 34.9 g (0.16 mol) of pyromellitic dianhydride are suspended, under nitrogen and with stirring, in 100 g of anhydrous N,N-dimethylacetamide in an apparatus of the type described under A. The suspension is cooled to −15° C., with stirring. 30.436 g (0.152 mol) of 4,4'-diaminodiphenyl ether are then dissolved in 140 g of anhydrous N,N-dimethylacetamide, with stirring, to give a clear solution which is added dropwise at −15° to −10° C. to the suspension in the course of 1 hour, the pyromellitic dianhydride going slowly into solution. The reaction mixture becomes markedly viscous and clear. The reaction is then allowed to go to completion at 0° to 5° C. during 1 further hour.

C. Preparation of the Polyamide/Polyimide Block Copolymer

Under nitrogen and with vigorous stirring, the solution of the polyamide with amino end groups, obtained according to A, is added dropwise at 0° to 5° C., in the course of 5 minutes, to the viscous solution of the polyamide acid with anhydride end groups, obtained according to B. The dropping funnel is rinsed with 100 g of anhydrous N,N-dimethylacetamide and the solution is added to the reaction mixture. The mixture is homogenised by stirring and the reaction is allowed to go to completion for 1 hour at 10° to 15° C.

This gives a clear, viscous, slightly yellowish solution of the polyamide/polyamide acid block copolymer having an inherent viscosity of 1.08 dl/g (c=0.5% in N,N-dimethylacetamide), which solution can be used directly for coating Cu foils.

D. Coating of Cu Foils

The block copolymer solution is evenly spread on Cu foils and pre-dried for 7 hours at 70° to 150° C./20 mbars, and is thus freed from solvent. The coated Cu foils are then subjected to a thermal treatment for 10 hours at 200° to 250° C./0.1 mbar, the polyamide acid blocks being cyclised to give polyimide blocks. This gives a well adhering, flexible, transparent and smooth coating on the Cu foil. The coating obtained has excellent electrical properties.

TABLE 1

Stability of the coated Cu foils in chlorinated hydrocarbons at RT.[+]

| | 7 days | 14 days | 30 days | 60 days |
|---|---|---|---|---|
| Chloroform | pass[++] | pass | pass | pass |
| Chlorobenzene | pass | pass | pass | pass |
| Carbon tetrachloride | pass | pass | pass | pass |
| Methylene chloride | pass | pass | pass | pass |
| Ethylene chloride | pass | pass | pass | pass |
| Trichloroethylene | pass | pass | pass | pass |

[+]RT = room temperature
[++]pass = no attack
Etching tests in FeCl$_3$: duration 15 minutes; no attack.
Foil: flexible.

To prepare a printed circuit, the laminate was coated on the Cu side with a photolacquer, exposed through a photo mask, developed in a chlorinated, solvent and etched in FeCl$_3$. This resulted in a flexible, printed circuit with excellent adhesion of the printed circuit tracks.

EXAMPLE 2

As in Example 1, a polyamide block is prepared, using 15.572 g (0.144 mol) of m-phenylenediamine, 25,988 g (0.128 mol) of isophthalic acid dichloride, 25.904 g (0.256 mol) of triethylamine and 195 g of N-methylpyrrolidone, and a polyamide acid block is prepared from 69.800 g (0.32 mol) of pyromellitic anhydride, 60.872 g (0.304 mol) of 4,4'-diaminodiphenyl ether and 615 g of N-methylpyrrolidone. The two solutions are mixed with one another, as in Example 1, and allowed to react. The resulting solution of the polyamide/polyamide acid block copolymer has an inherent viscosity of 0.98 dl/g, measured on a 0.5% solution in N-methylpyrrolidone. With the aid of a doctor blade (gap width 500μ), this copolymer solution is evenly spread on that side of a 35μ thick copper foil (commercial product from Messrs. Yates, Luxemburg) which had been subjected to a TW treatment. The coated foil is warmed in a horizontal position in a circulating air oven, the temperature being raised stepwise from 70° to 170° C. and the latter temperature then being maintained for 2 hours. During this procedure, the solvent evaporates, and a polyamide/polyimide film is formed which cannot be peeled off the copper foil. The total thickness of this laminate is 60–63μ. Nevertheless, it possesses excellent thermal stability and can be immersed for over 5 minutes in a hot soldering bath at 260° C., without being damaged. This is important, since flexible, printed circuits must withstand a soldering process without damage.

Moreover, the laminate has excellent solvent resistance, in particular resistance to the solvents used in printed circuit board technology. Table 2 below gives the percentage increase in weight, which this laminate formed from the block copolymers and copper suffers after being stored for 15 hours in these solvents at 25° C.:

TABLE 2

| Solvent | Increase in weight [%] |
|---|---|
| Dimethylformamide | 2 |
| Cyclohexanone | 0.05 |
| 1,1,1-Trichloroethane | 0.1 |
| 5% sodium carbonate solution | 0.5 |
| Distilled water | 0.09 |

Storage of the laminate in the solvents of Table 1 of Example 1 for 60 days does not cause any damage. Etching test in FeCl$_3$: duration 15 minutes; no attack. Foil: flexible.

EXAMPLE 3

As in Example 2, a polyamide block is prepared, 195 g of N,N-dimethylacetamide being used as the solvent in place of N-methylpyrrolidone, and a polyamide acid block is prepared from 69.800 g (0.32 mol) of pyromellitic anhydride, 61.600 g (0.31 mol) of 4,4'-diaminodiphenylmethane and 615 g of N,N-dimethylacetamide. As in Example 1, the two solutions are mixed with one another and allowed to react. The inherent viscosity of the block copolymers is 0.85 dl/g, measured on a 0.5% solution.

0.2 part by weight, relative to the solids content, of the flow control agent "Modaflow" (commercial product from Messrs. Monsanto) is added to one part of this block copolymer solution; this product is not added to the other part.

As described in Example 2, the two solutions are evenly spread on the rough side of copper foils with the aid of a doctor blade. In a horizontal position, the coated foils are warmed to 130° C. in an oven, the solvent evaporating and a non-tacky coating being formed on the copper foils. In total, the laminate is heated for 1 hour at 130° and for 2 hours at 170° C.

After this treatment, a smooth, completely uniform polyamide/polyimide layer which adheres very firmly to the copper has been formed from the solution containing "Modaflow". By contrast, the polyamide/polyimide layer formed under these preparation conditions from the solution which does not contain any "Modaflow" is inhomogeneous.

The total thickness of the flexible base material, having a perfect appearance, is 62μ. The copper foils and block copolymer films adhere very firmly to one another; even repeated folding or flexing does not cause any damage. They resist soldering baths (260° C.) for longer than 5 minutes.

Because of its excellent electrical properties, even at an elevated temperature (see Table 3), this laminate is suitable for the preparation of printed, flexible circuits having an improved heat stability.

TABLE 3

| Temperature [°C.] | Volume resistivity[+] [Ω cm] | Dielectric loss factor tg δ[++] [%] |
|---|---|---|
| 23 | 2.3 × 10$^{15}$ | 0.45 |
| 50 | 1.7 × 10$^{15}$ | 0.90 |
| 80 | 6.8 × 10$^{14}$ | 1.29 |
| 100 | 6.3 × 10$^{14}$ | |
| 120 | 1.8 × 10$^{14}$ | |
| 150 | 1.7 × 10$^{15}$ | 8.13 |

[+]according to DIN 53,482
[++]according to DIN 53,483

The advantageous dielectric properties are underlined by the very low frequency dependence of the dielectric loss factor (see Table 4).

TABLE 4

| Frequency (cycles per second) | Dielectric loss factor tg δ (%)+ |
|---|---|
| 50 | 0.64 |
| $10^2$ | 0.59 |
| $10^3$ | 0.55 |
| $10^4$ | 0.69 |
| $10^5$ | 1.12 |
| $10^6$ | 1.19 |
| $10^7$ | 1.02 |

+according to DIN 53,483.

The laminate has very good solvent resistance, in particular to the solvents used in printed circuit board technology. Table 5 gives the percentage increase in weight which this laminate shows after it has been stored for 16 hours at 25° C. in these solvents:

TABLE 5

| Solvent | Increase in weight [%] |
|---|---|
| Dimethylformamide | +5.2 |
| Cyclohexanone | 0.0 |
| Trichloroethane | 0.0 |
| 5% sodium carbonate solution | +0.32 |
| Distilled water | +0.57 |

Storage for 60 days in the solvents of Table 1 of Example 1 does not cause any damage. Etching test in FeCl₃: duration 15 minutes; no attack. Foil: flexible.

EXAMPLE 4

As in Example 1, a polyamide block is prepared, using 187.0 g (1.73 mols) of m-phenylenediamine, 312.0 g (1.5367 mols) of isophthalic acid dichloride and 310.9 g (3.0724 mols) of triethylamine in 2,820 g of N,N-dimethylacetamide, and a polyamide acid block is prepared from 837.6 g (3.84 mols) of pyromellitic dianhydride and 730.5 g (3.648 mols) of 4,4'-diaminodiphenyl ether in 8,600 g of N,N-dimethylacetamide. As in Example 1, the two solutions are mixed with one another and allowed to react. The resulting solution of the polyamide/polyamide acid block copolymer has an inherent viscosity of 1.1756 dl/g, measured on a 0.5% solution. 0.2 percent by weight of "Modaflow" (relative to the solids content of the solution of the polyamide/polyamide acid block copolymer) is added to this solution. The laminate was prepared as follows:

A 35μ thick copper foil is drawn from a roll at a defined speed, passed horizontally through an oven and wound up again after it has emerged from the oven. Before it enters the oven, the solution of the polyamide/polyamide acid block copolymer is applied in the desired thickness (for example 400μ) by means of a metering unit. The solvent evaporates in the oven and a tack-free, firmly adhering film is formed on the copper. After it has passed through the oven, the laminate can be wound up again without any problems. The speed of the copper strip and the oven temperature should be selected in such a way that the laminate is tack-free when it leaves the oven. To achieve optimum properites, the laminate can be heated afterwards, for example at 180° for 4 hours and at 210° C. for 2 hours.

The laminate thus obtained can be intensively flexed without any damage; it possesses excellent electrical properties. Table 5 gives the dielectric loss factor tg δ as a function of the temperature, compared with the commercially available laminate "Contiflex GT 7510"; this product is prepared by bonding a polyimide film to a copper foil.

TABLE 6

| | Dielectric loss factor tg δ* | |
|---|---|---|
| Measurement temperature [°C.] | Laminate according to Example 4 [%] | Contiflex GT 7510 [%] |
| 23 | 0.7 | 3.4 |
| 50 | 0.75 | 9.4 |
| 80 | 0.75 | 7.3 |
| 100 | 0.85 | 4.7 |
| 130 | 1.10 | 1.11 |

*according to DIN 53,483, at 50 cycles per second.

It will be seen from Table 6 that the dielectric loss factor tg δ of the commercial product "Contiflex" is highly dependent on the temperature and therefore disadvantageous.

After storage for 60 days at room temperature in the solvents of Table 1 of Example 1, the laminate according to the invention has not been damaged. It is resistant to soldering baths for more than 5 minutes at 260° C.

EXAMPLE 5

As in Example 1, a polyamide block is prepared from 17.844 g (0.09) of 4,4'-diaminodiphenylmethane, 16.242 g (0.08 mol) of isophthalic acid dichloride and 16.19 g (0.16 mol) of triethylamine in 180 g of dimethylacetamide, and a polyamide acid block is prepared from 58.892 g (0.27 mol) of pyromellitic dianhydride and 51.550 g (0.26 mol) of 4,4'-diaminodiphenylmethane in 600 g of dimethylacetamide.

As in Example 1, the two solutions are mixed with one another and allowed to react. The resulting solution of the polyamide/polyamide acid block polymer has an inherent viscosity of 1.246 dl/g (0.5% solution in dimethylacetamide; at 20° C.) 0.22 g of "Modaflow" is added to 740 g of this solution. The solution is applied to the rough side of a 35 μm thick copper foil with the aid of a doctor blade (gap width 500 μm), and the foil, in a horizontal position, is heated in a circulating air drying cabinet for 1 hour at 130°, for 2 hours at 180°, for 3 hours at 210° and for 3 hours at 240° C. In this way, uniform polyamide/polyimide film is formed which firmly adheres to the copper and the dielectric test data of which are given in Table 7.

EXAMPLE 6

56.71 g (0.26 mol) of pyromellitic dianhydride are suspended at 0° C. in 500 g of N-methylpyrrolidone (abbreviated: NMP); a solution of 53.53 g (0.27 mol) of 4,4'-diaminodiphenylmethane in 400 g of NMP is added dropwise to the suspension at 0°-5° C., with stirring. The resulting clear solution is stirred for one hour at 0°-5° C., before a solution of 15.86 g (0.08 mol) of 4,4'-diaminodiphenylmethane in 300 g of NMP is added. Subsequently, 18.27 g (0.09 mol) of isophthalic acid dichloride are added in portions at 0°-5° C., the reaction is allowed to continue for 30 minutes, 10.45 g (0.18 mol) of propylene oxide are then added and the reaction is again allowed to continue for about 60 minutes, before 0.3 g of "Modaflow" is added to the clear solution. The latter has an inherent viscosity of 1.72 dl/g (0.5% solution in NMP).

As described in Example 5, this solution is used for coating a copper foil which is finally heated at 240° C. for a further 3 hours. The dielectric test data of the coated copper foil are contained in Table 7. The coating is free from surface defects.

EXAMPLE 7

As in Example 6, a solution of a polyamide acid block is prepared from 56.71 g (0.26 mol) of pyromellitic dianhydride suspended in 500 g of of NMP and 53.53 g (0.27 mol) of 4,4'-diaminodiphenylmethane dissolved in 400 g of NMP, and 8.65 g (0.08 mol) of m-phenylenediamine in 200 g of NMP, 18.25 g (0.09 mol) of isophthalic acid dichloride in 100 g of NMP and 10.45 g (0.18 mol) of propylene oxide are added to the above solution and, finally, 0.3 g of "Modaflow" is added to the whole. The inherent viscosity of the solution is 1.48 dl/g (0.5% solution in NMP).

As described in Example 5, this solution is used for coating a copper foil which is finally heated at 240° C. for a further 3 hours; the dielectric test data are described in Table 7. The coating is free from surface defects.

EXAMPLE 8

As in Example 6, a solution of a polyamide acid block is prepared from 56.71 g (0.26 mol) of pyromellitic dianhydride suspended in 500 g of NMP and 53.53 g (0.27 mol) of 4,4'-diaminodiphenylmethane dissolved in 400 g of NMP, and 4.325 g (0.04 mol) of m-phenylenediamine and 7.93 g (0.04 mol) of 4,4'-diaminodiphenylmethane in 200 g of NMP, 18.25 g (0.09 mol) of isophthalic acid dichloride in 100 g of NMP and 10.45 g of propylene oxide are added to the above solution, and finally 0.3 g of "Modaflow" is added to the whole. The inherent viscosity of the solution is 1.24 dl/g (5% solution in NMP).

As described in Example 5, this solution is used for coating a copper foil which is finally heated at 240° C. for a further 3 hours. The dielectric test data are contained in Table 7; the coating is free from surface defects.

EXAMPLE 9

As in Example 1, a polyamide block is prepared from 28.08 g (0.26 mol) of m-phenylenediamine, 50.75 g (0.25 mol) of isophthalic acid dichloride and 25.25 g (0.25 mol) of triethylamine in 350 g of dimethylacetamide, and a polyamide acid block is prepared from 34.88 g (0.16 mol) of pyromellitic dianhydride and 29.70 g (0.15 mol) of 4,4'-diaminodiphenylmethane in 300 g of dimethylacetamide. The two clear solutions are mixed and allowed to react for one hour. The solution has an inherent viscosity of 0.90 dl/g (0.5% solution in dimethylacetamide in 20° C.).

After the addition of 0.2 percent by weight of "Modaflow", this solution is used for coating a copper foil, as in Example 5. After evaporation of the solvent, the foil is heated for 1 hour at 130°, 4 hours at 180° and 3 hours at 210° C., a firmly adhering polyamide/polyimide film being formed, the dielectric test data of which are contained in Table 7. The coating is even, and free from so-called "craters" or "orange peel".

EXAMPLE 10

In the same manner as in Example 7, a solution of a polyamide/polyamide acid block copolymer is prepared, having an inherent viscosity of 1.65 dl/g (0.5% solution in NMP; 20° C.).

0.1% by weight (relative to solid matter) of the commercially available flow control agents "FC-170 C" and "FC-430" (commercial product from Messrs. 3M) or "Lodyne S 107" (commerical product from Ciba-Geigy) are in each case added to 150 g of this solution. Each of these solutions is used for coating a copper foil. After evaporation of the solvent at about 120° C., the coated foil is heated to 240° C. and kept for 2 hours at this temperature. After this time, the copper foils are coated with an even layer of the polyamide/polyimide.

Without the addition of these flow control agents, there is a risk of the coating being uneven (formation of "craters" or "orange peel").

TABLE 7

|  | Example 5 | Example 6 | Example 7 | Example 8 | Example 9 | Example 10** |
|---|---|---|---|---|---|---|
| Dielectric loss factor tg δ (%)* at | | | | | | |
| 23° C. | 0.23 | 0.23 | 0.20 | 0.30 | 0.48 | 0.49 |
| 100 | 0.15 | 0.20 | 0.17 | 0.17 | 0.81 | 0.61 |
| 150 | 0.21 | 0.29 | 0.24 | 0.22 | | 0.64 |
| 200 | 0.47 | 1.01 | 0.66 | 0.60 | | 1.58 |
| 230 | 2.14 | 4.15 | 2.78 | 2.13 | | |
| Volume resistivity (Ω × cm) at | | | | | | |
| 23° C. | $3.6 \times 10^{16}$ | $6.9 \times 10^{16}$ | $6.0 \times 10^{16}$ | $5.5 \times 10^{16}$ | $9.2 \times 10^{15}$ | |
| 100 | $2.0 \times 10^{15}$ | $8.2 \times 10^{15}$ | $1.8 \times 10^{16}$ | $3.1 \times 10^{15}$ | $5.4 \times 10^{14}$ | |
| 150 | $3.4 \times 10^{14}$ | $6.0 \times 10^{15}$ | $1.3 \times 10^{15}$ | $9.2 \times 10^{14}$ | | |
| 200 | $2.7 \times 10^{13}$ | $9.0 \times 10^{13}$ | $3.3 \times 10^{14}$ | $1.3 \times 10^{14}$ | | |
| 230 | | $1.8 \times 10^{13}$ | $4.5 \times 10^{13}$ | $3.1 \times 10^{13}$ | | |

*according to DIN 53,482 at 50 cycles per second.
**addition of 0.1% of "Lodyne S 107".

Table 7 shows that, in an advantageous manner, the dielectric properties of the flexible laminates according to the invention are independent of the measuring temperature, as compared with the commerical product quoted in Table 6.

What is claimed is:

1. A flexible, printed circuit with excellent adhesion of the printed circuit tracks, which is obtained by
    coating one side of a metal foil without any interlayer with a polymer consisting of a polyamide/polyimide block copolymer with recurring structural elements of the formula I

(I)

in which n is a integer from 1 to 500, A is a polyamide block with a basic structural unit of the formula II or III

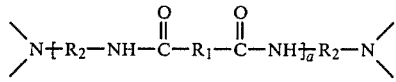 (II)

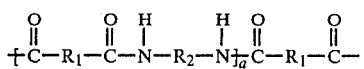 (III)

and E is a polyimide block with a basic structural unit of the formula IV or V

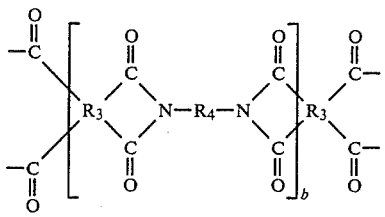 (IV)

or

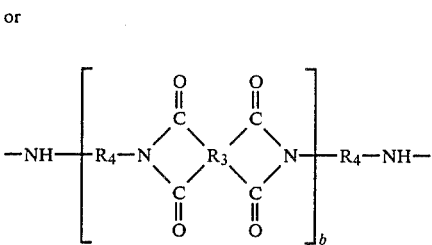 (V)

or consists of a polyamide/polyimide copolymer which is obtained by reacting a polyamide acid of the formula IVa or Va

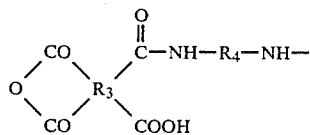 (IVa)

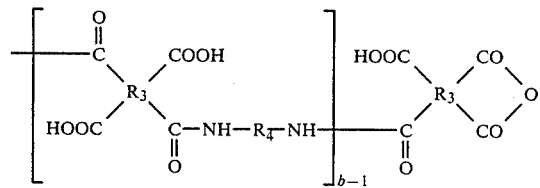

or

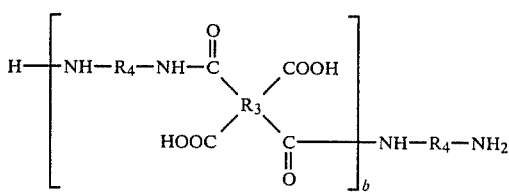 (Va)

with a dicarboxylic acid dichloride of the formula XI

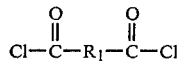 (XI)

and a diamine of the formula XII

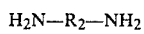 (XII)

and subsequently cyclising the polyamide/polyamide acid copolymer thus obtained, in which formulae a and b independently of one another are integers from 2 to 100, $R_2$ and $R_4$ independently of one another are a monocyclic aromatic radical which is unsubstituted or substituted by halogen atoms or alkyl or alkoxy groups each having 1-4 C atoms, an unfused bicyclic aromatic radical which is unsubstituted or substituted by halogen atoms or alkyl or alkoxy groups each having 1-4 C atoms and in which the aromatic nuclei are linked together via —O—, —CH$_2$—or —SO$_2$—, or a heterocyclic radical, alkylene having 2-12 C atoms or a dicyclohexylmethane radical, $R_1$ is an aromatic or heterocyclic radical or alkylene having 2 to 8 C atoms, the carbonyl groups being bonded to different carbon atoms, and $R_3$ is a 5-membered or 6-membered cycloalkyl radical, a benzene ring or an unfused bicyclic aromatic radical in which the aromatic nuclei are linked together via the bridge member —O—, —CO— or —CONH— and the carbonyl groups are bonded to different ring C atoms which are adjacent in pairs, heating the coated metal foil in the temperature range from 50° to 300° C. till a track-free coating is obtained, exposing the opposite side of the coated metal foil, which side is provided with a photolacquer, through a photo mask, and developing the exposed metal foil.

2. A circuit according to claim 1, wherein the coated metal foil is a copper foil.

3. A circuit according to claim 1, wherein the polymer consists of a polyamide/polyimide block copolymer of the formula I, in which n is an integer from 1 to 500. A is a polyamide block of the formula II or III and E is a polyimide block of the formula IV or V, and in which a and b independently of one another are integers from 2 to 100, $R_2$ and $R_4$ independently of one another are a monocyclic aromatic radical which is unsubstituted or substituted by halogen atoms or alkyl or alkoxy groups each having 1-4 C atoms, an unfused bicyclic aromatic radical which is unsubstituted or substituted by halogen atoms or alkyl or alkoxy groups each having 1-4 C atoms and in which the aromatic nuclei are linked together via —O—, —CH$_2$—or —SO$_2$—, or a heterocyclic radical, $R_1$ is an aromatic or heterocyclic radical, the carbonyl groups being bonded to different carbon atoms, and $R_3$ is a benzene ring or an unfused bicyclic aromatic radical in which the aromatic nuclei are linked together via the bridge member —O—, —CO— or —CONH—, the carbonyl groups being bonded to different ring carbon atoms which are adjacent in pairs.

4. A circuit according to claim 1, wherein the polymer consists of a polyamide/polyimide block copolymer of the formula I, in which A is a polyamide block of the formula II and E is a polyimide block of the formula IV, and in which a is an integer from 2 to 50 and b is an integer from 2 to 50, especially 10 to 50.

5. A circuit according to claim 1, wherein the polymer consists of a polyamide/polyimide block copolymer of the formula I, in which A is a polyamide block of the formula II and E is a polyimide block of the formula IV, and in which a is an integer from 2 to 50 and b is an integer from 10 to 50, $R_1$ is a 1,3-phenylene radical, $R_2$ is a 4,4'-diphenyl ether, 4,4'-diphenylmethane or 1,3-phenylene radical, $R_3$ is a benzene ring or a benzophenone ring system and $R_4$ is a 4,4'-diphenyl ether, 4,4'-diphenylmethane, 1,3-phenylene or 1,4-phenylene radical.

6. A circuit according to claim 1, wherein the polymer consists of a polyamide/polyimide copolymer which is obtained by reacting a polyamide acid of the formula IVa or Va with a dicarboxylic acid dichloride of the formula XI and a diamine of the formula XII, in which formulae b is an integer from 2–50, $R_1$ is $-(CH_2)_4-$ or 1,3-phenylene, $R_2$ is 1,3-phenylene or a 4,4'-diphenyl ether radical, $R_3$ is a benzene ring or a benzophenone ring system and $R_4$ is 1,3- or 1,4-phenylene or a 4,4'-diphenyl ether or 4,4'-diphenylmethane radical, and subsequently cyclising the polyamide/polyamide acid copolymer obtained.

* * * * *